(12) United States Patent
Yang et al.

(10) Patent No.: US 11,416,043 B2
(45) Date of Patent: Aug. 16, 2022

(54) DISPLAY MOTHERBOARD, MANUFACTURING AND CUTTING METHODS THEREOF

(71) Applicants: Chengdu BOE Optoelectronics Technology Co., Ltd., Sichuan (CN); BOE Technology Group Co., Ltd., Beijing (CN)

(72) Inventors: Ming Yang, Beijing (CN); Wei Wang, Beijing (CN); Bin Liu, Beijing (CN); Keheng Li, Beijing (CN); Yang Dang, Beijing (CN); Shaojie Qin, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 17/041,476

(22) PCT Filed: Mar. 27, 2020

(86) PCT No.: PCT/CN2020/081752
§ 371 (c)(1),
(2) Date: Sep. 25, 2020

(87) PCT Pub. No.: WO2020/207273
PCT Pub. Date: Oct. 15, 2020

(65) Prior Publication Data
US 2021/0157373 A1    May 27, 2021

(30) Foreign Application Priority Data

Apr. 9, 2019   (CN) .................. 201910281758.X

(51) Int. Cl.
*G06F 1/18* (2006.01)
*H05K 3/00* (2006.01)

(52) U.S. Cl.
CPC ........... *G06F 1/184* (2013.01); *H05K 3/0052* (2013.01); *H01L 2251/566* (2013.01)

(58) Field of Classification Search
CPC . H01L 21/78; H01L 2251/566; H05K 3/0052; B23K 26/364; B23K 26/36; G02F 1/133351
See application file for complete search history.

(56) References Cited

U.S. PATENT DOCUMENTS 4,216,523 A * 8/1980 Harford ................. H05K 1/142
361/729
4,681,656 A * 7/1987 Byrum .................. C04B 41/009
156/151

(Continued)

FOREIGN PATENT DOCUMENTS

| CN | 1441290 A | 9/2003 |
|---|---|---|
| CN | 1698005 A | 11/2005 |

(Continued)

OTHER PUBLICATIONS

International search report of PCT application No. PCT/CN2020/081752 dated Jun. 23, 2020.

(Continued)

*Primary Examiner* — James Wu
(74) *Attorney, Agent, or Firm* — Fay Sharpe LLP

(57) ABSTRACT

A display motherboard includes a motherboard body, wherein n recess structures for guiding the motherboard body to fracture are provided on a surface of the motherboard body, n being greater than 1; wherein the n recess structures are arranged in sequence and centers of the n recess structures are collinear.

14 Claims, 10 Drawing Sheets

(56) References Cited

U.S. PATENT DOCUMENTS

| | | | |
|---|---|---|---|
| 10,510,987 B2 * | 12/2019 | Ma | C04B 41/009 156/151 |
| 2005/0255618 A1 | 11/2005 | Kiyomiya et al. | |
| 2007/0275493 A1 | 11/2007 | Miyachi et al. | |
| 2008/0257944 A1 | 10/2008 | Blin | |
| 2009/0200555 A1 | 8/2009 | Ishihama | |
| 2012/0281302 A1 | 11/2012 | Penniman et al. | |
| 2018/0304412 A1 | 10/2018 | Liu | |
| 2019/0131569 A1 | 5/2019 | Ma et al. | |

FOREIGN PATENT DOCUMENTS

| | | | |
|---|---|---|---|
| CN | 1725501 A | 1/2006 | |
| CN | 1989044 A | 6/2007 | |
| CN | 202213775 U | 5/2012 | |
| CN | 102768394 A | 11/2012 | |
| CN | 102785853 A | 11/2012 | |
| CN | 104727448 A | 6/2015 | |
| CN | 106024704 A | 10/2016 | |
| CN | 106914707 A | 7/2017 | |
| CN | 206662561 U | 11/2017 | |
| CN | 107785505 A | 3/2018 | |
| CN | 107785505 A * | 3/2018 | H01L 51/5256 |
| CN | 108022878 A | 5/2018 | |
| CN | 108163313 A | 6/2018 | |
| CN | 207545214 U | 6/2018 | |
| CN | 108628021 A | 10/2018 | |
| CN | 108777251 A | 11/2018 | |
| CN | 109979318 A | 7/2019 | |
| JP | 2011191693 A | 9/2011 | |

OTHER PUBLICATIONS

First office action of Chinese application No. 201910281758.X dated Oct. 9, 2020.

Notification to grant patent right for invention of Chinese application No. 201910281758.X dated Jan. 12, 2021.

Chaoyong Zhang, et al; Inspection System for Detection of Defects on Rail Surface Based on LED and Linear Laser, Science Technology and Engineering, vol. 12 No. 36, Dec. 31, 2012, pp. 9877-9880 and 9884.

* cited by examiner

Manufacturing a motherboard body, wherein n recess structures for guiding the motherboard body to fracture are disposed on a surface of the motherboard body, n being m greater or than or equal to 1 — S701

FIG. 8

Forming an organic layer and an inorganic material layer that are stacked — S801

Forming a cutting groove in the surface, distal from the organic layer, of the inorganic material layer — S802

Forming n recess structures on a bottom surface of the cutting groove for guiding a motherboard body to fracture to obtain the motherboard body — S803

Forming a plurality of leads on a target surface of the motherboard body to obtain a display motherboard — S804

FIG. 9

DISPLAY MOTHERBOARD, MANUFACTURING AND CUTTING METHODS THEREOF

The present disclosure is a 371 of PCT Application No. PCT/CN2020/081752, filed on Mar. 27, 2020, claims priority to Chinese patent application No. 201910281758.X, filed on Apr. 9, 2019 and entitled "DISPLAY MOTHERBOARD, MANUFACTURING AND CUTTING METHODS THEREOF, DISPLAY SUBSTRATE AND DISPLAY DEVICE", the contents of which are incorporated herein by reference in their entirety.

TECHNICAL FIELD

The present disclosure relates to a display motherboard, manufacturing and cutting methods thereof, a display substrate and a display device.

BACKGROUND

The display substrate plays an important role in a display device. During manufacture of the display substrate, a display motherboard is usually manufactured first, and then cut into multiple display substrates.

SUMMARY

The present disclosure provides a display motherboard, manufacturing and cutting methods thereof, a display substrate and a display device. The technical solutions are described as below.

In one aspect, a display motherboard is provided. The display motherboard includes a motherboard body;

wherein n recess structures for guiding the motherboard body to fracture are provided on a surface of the motherboard body, n being greater than 1; wherein the n recess structures are arranged in sequence and centers of the n recess structures are collinear.

Optionally, the recess structure includes a pit or a through hole.

Optionally, an opening of the recess structure has at least one of a first symmetry axis and a second symmetry axis; wherein the first symmetry axis is parallel to an arrangement direction of the n recess structures, and the second symmetry axis is perpendicular to the arrangement direction of the n recess structures.

Optionally, the motherboard body is further provided with a cutting groove the n recess structures being in the cutting groove.

Optionally, the cutting groove is stripe-shaped, and a lengthwise direction of the cutting groove is parallel to the arrangement direction of the n recess structures.

Optionally, a bottom surface of the cutting groove has a third symmetry axis, wherein the third symmetry axis is parallel to the arrangement direction of the n recess structures.

Optionally, the third symmetry axis passes through a center of an opening, at a bottom surface of the cutting groove, of each of the recess structures.

Optionally, the display motherboard further includes a plurality of leads on one surface of the motherboard body, and the recess structure is between any two adjacent leads.

Optionally, one of the recess structures is disposed between each two adjacent leads.

Optionally, the motherboard body includes an organic layer and a light-shielding layer.

The light-shielding layer is between the organic layer and the leads. An orthographic projection of the light-shielding layer on the organic layer is outside an orthographic projection of the recess structure on the organic layer, and is overlapped with at least part of orthographic projections of the plurality of leads on the organic layer.

Optionally, the motherboard body further includes an organic layer between the light-shielding layer and the leads.

In another aspect, a method for manufacturing a display motherboard is provided. The method is applicable to manufacturing of the display motherboard according to the present disclosure, and includes:

manufacturing a motherboard body, wherein n recess structures for guiding the motherboard body to fracture are disposed on a surface of the motherboard body, n being greater than 1; and wherein the n recess structures are arranged in sequence and centers of the n recess structures are collinear.

Optionally, manufacturing the motherboard body includes:

forming an organic layer and an inorganic material layer that are stacked;

forming a cutting groove in the surface, distal from the organic layer, of the inorganic material layer;

forming n recess structures and a light-shielding layer on a bottom surface of the cutting groove to obtain the motherboard body, and forming a plurality of leads on one surface of the motherboard body, the recess structure being between any two adjacent leads;

wherein n is greater than 1, the n recess structures are arranged in sequence. The cutting groove is stripe-shaped; a lengthwise direction of the cutting groove is parallel to an arrangement direction of the n recess structures; and the cutting groove has a third symmetry axis, the third symmetry axis being parallel to the arrangement direction of the n recess structures, and the third symmetry axis passing through centers of openings, at a bottom surface of the cutting groove, of the n recess structures;

the recess structure includes a pit, one of the recess structures is disposed between each two adjacent leads; and an opening of the recess structure has a first symmetry axis and a second symmetry axis, wherein the first symmetry axis is parallel to the arrangement direction of the n recess structures, and the second symmetry axis is perpendicular to the arrangement direction of the n recess structures.

In yet another aspect, a method for cutting a display motherboard is provided. The method is applicable to cutting of the display motherboard according to the present disclosure, and includes:

making the display motherboard fracture along a target path that passes through the n recess structures by a physical force, wherein n is greater than or equal to 1.

Optionally, the recess structure includes a pit, and before making the display motherboard fracture along the target path that passes through the n recess structures by the physical force, the method further includes:

irradiating the n recess structures by laser so as to break through each of the recess structures into a through hole.

Optionally, for each of the n recess structures, a spacer portion in the display motherboard is removed when the recess structure is irradiated by the laser;

an orthographic projection area of the recess structure on a reference plane is within an orthographic projection area of the spacer portion on the reference plane, and the reference plane is parallel to the display motherboard.

Optionally, the spacer portion is trumpet-shaped, the end having a larger area of the spacer portion is distal from the recess structure, and each two adjacent spacer portions are connected to each other.

In still another aspect, a display substrate is provided. The display substrate is obtained by cutting a display motherboard via the cutting method according to the present disclosure, the display motherboard is the display motherboard according to the present disclosure; and a surface of the display substrate includes two plate surfaces facing each other and a plurality of side surfaces for connecting the two plate surfaces, at least one of the side surfaces being provided with at least one groove in communication with at least one of the plate surfaces.

Optionally, one of the two plate surfaces is provided with a plurality of leads, and the groove is between any two adjacent leads.

In still yet another aspect, a display device is provided. The display device includes the display substrate according to the present disclosure.

BRIEF DESCRIPTION OF DRAWINGS

FIG. 8 is a flowchart of a method for manufacturing a display motherboard according to an embodiment of the present disclosure;

FIG. 9 is a flowchart of another method for manufacturing a display motherboard according to an embodiment of the present disclosure;

DESCRIPTION OF EMBODIMENTS

In order to make the principles and the technical solutions of the present disclosure clearer, the embodiments of the present disclosure will be described in detail below in combination with the accompanying drawings.

The display substrate plays an important role in a display device. During manufacture of the display substrate, a display motherboard is usually manufactured first, and then cut into multiple display substrates. In the related art, the display motherboard is cut by using laser, resulting in a relatively simple cutting mode of the display motherboard. Embodiments of the present disclosure provide a display motherboard, and based on the structure of the display motherboard, the display motherboard may be cut by using a process other than laser cutting.

Figure 1:
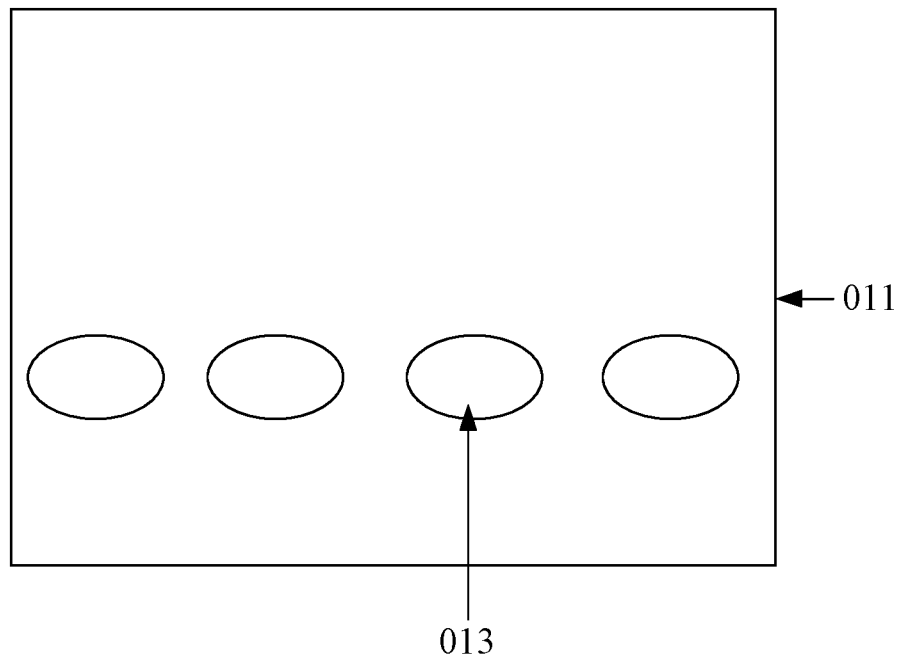
FIG. 1 is a partial schematic structural diagram of a display motherboard according to an embodiment of the present disclosure.

Exemplarily, FIG. 1 is a partial schematic structural diagram of a display motherboard according to an embodiment of the present disclosure. As shown in FIG. 1, the display motherboard 01 includes a motherboard body 011. N recess structures 013 for guiding the motherboard body 011 to fracture are provided on a surface of the motherboard body 011, and n is greater than or equal to 1.

In the display motherboard according to the embodiment of the present disclosure, the n recess structures for guiding the motherboard body to fracture are provided on the surface of the motherboard body. In this way, during cutting of the display motherboard, a physical force may be applied to make the display motherboard fracture along a target path that passes through the n recess structures. In this process, it is unnecessary to irradiate the display motherboard by laser, thereby enriching the cutting modes of the display motherboard.

Figure 2:
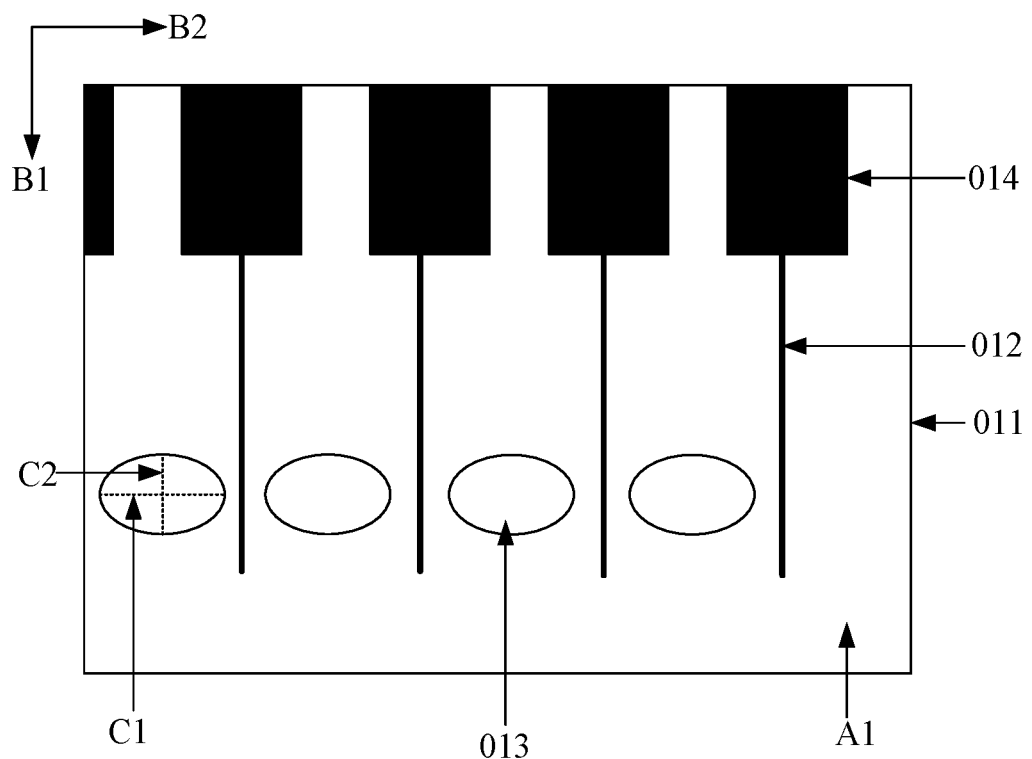
FIG. 2 is a partial schematic structural diagram of another display motherboard according to an embodiment of the present disclosure.

Optionally, FIG. 2 is a partial schematic structural diagram of another display motherboard according to an embodiment of the present disclosure. As shown in FIG. 2, the display motherboard 01 further includes a plurality of leads 012 on one surface of the motherboard body 011. The recess structure 013 is between any two adjacent leads 012.

Exemplarily, the one surface may be referred to as a target surface A1. The n recess structures 013 in the display motherboard may be on at least one surface of the display motherboard 01. The embodiment of the present disclosure takes the case that the n recess structures 013 are all on the target surface A1 as an example. Certainly, the n recess structures 013 may also not be on the target surface A1, which is not limited in the embodiments of the present disclosure.

It should be noted that, since it may be unnecessary to irradiate the display motherboard by laser in the process of cutting the display motherboard according to the embodiment of the present disclosure, an organic material in the display motherboard is prevented from being carbonized into carbon granules in the case that the display motherboard includes the organic material, thereby avoiding short circuits between the leads due to the carbon granules, and improving the manufacturing yield of the display substrate obtained by cutting the display motherboard.

Optionally, the recess structure in the embodiments of the present disclosure may be a pit or a through hole. The embodiments of the present disclosure take the case that the recess structure is the pit as an example. Regardless of whether the recess structure is the pit or through hole, a physical force may be directly applied to make the display motherboard fracture along the target path that passes through the n recess structures during cutting of the display motherboard. If the recess structure is the pit, during cutting of the display motherboard, laser may be adopted to irradiate the n pits in the motherboard body to turn the n pits into n through holes, and then a physical force is applied to make the display motherboard fracture along the target path that passes through the n recess structures. In the case that the n pits are irradiated by laser, if the organic material in the display motherboard is carbonized into the carbon granules, the carbon granules are less likely to be deposited on the leads since the recess structures are between the adjacent leads, and the probability of short circuits between the leads due to the carbon granules is thereof also low. Therefore, the manufacturing yield of the display substrate obtained by cutting the display motherboard is improved.

It should be noted that n is greater than or equal to 1, i.e., at least one recess structure 013 is provided on the surface of the motherboard body 011. The embodiment of the present disclosure takes the case that a plurality of recess structures 013 are provided on the surface of the motherboard body 011 as an example. Optionally, there may also be only one recess structure 013 on the surface of the motherboard body 011, which is not limited in the embodiments of the present disclosure. When n is greater than 1, the n recess structures 013 may be arranged in sequence (e.g., evenly spaced apart in sequence).

In the embodiment of the present disclosure, each of the recess structures 013 is between two adjacent leads 012. That is, for each two adjacent leads 012 in the display motherboard 01, there may be or may not be a recess structure 013 between the two leads 012, which is not limited in the embodiments of the present disclosure. FIG. 2 takes the case that each two adjacent leads 012 is provided with a recess structure therebetween as an example. Further, if the recess structure 013 is provided between each two adjacent leads 012, there may be one or a plurality of recess structures between the two leads 012. FIG. 2 takes the case that there is one recess structure 013 between each two adjacent leads 012 as an example.

Optionally, the leads 012 in FIG. 2 may be data lines or other signal lines (e.g., grid lines). Each of the leads 012 may be electrically connected to one pin 014.

In addition, the display motherboard 01 may be divided into multiple display substrates, and each display substrate may be divided into a display area and a binding area (also called a Pad area). The leads 012 in the binding area are configured to be electrically connected to a flexible printed circuit (FPC). The aforementioned recess structures 013 may be in the binding area.

Optionally, continue to refer to FIG. 2, an extension direction B1 of each lead 012 may be perpendicular to an arrangement direction B2 of the plurality of leads. In the embodiment of the present disclosure, since the recess structure 013 is between any two adjacent leads 012, a maximal length of the recess structure 013 in the arrangement direction B2 of the plurality of leads is smaller than a distance between the two leads 012 adjacent to the recess structure 013.

Optionally, n is greater than 1, and the n recess structures 013 in the display motherboard may be arranged in sequence in the arrangement direction B2 of the plurality of leads 012. Moreover, when n is greater than 1, centers of the n recess structures 013 may be collinear. In this way, the display motherboard may be effectively cut along a straight line that passes through the n recess structures 013, Thus, the cutting effect of the display motherboard is better, and edges of the display substrates obtained by cutting are even.

Optionally, an opening of the recess structure 013 (e.g., an opening proximal to the target surface) has: at least one symmetry axis of a first symmetry axis and a second symmetry axis. As shown in FIG. 2, the at least one symmetry axis includes a first symmetry axis C1 and a second symmetry axis C2. FIG. 2 takes the case that the first symmetry axis C1 is parallel to the arrangement direction B2 of the plurality of leads (i.e., the arrangement direction of the n recess structures 013), and the second symmetry axis C2 is perpendicular to the arrangement direction B2 of the plurality of leads as an example. Optionally, the first symmetry axis C1 may not be parallel to the arrangement direction B2 of the plurality of leads, and the second symmetry axis C2 may not be perpendicular to the arrangement direction B2. In addition, when n is greater than 1, the first symmetry axes C1 of the openings of the n recess structures 013 may be the same.

In the case that the opening of the recess structure 013 has the first symmetry axis C1 and the second symmetry axis C2, the opening of the recess structure 013 may be circular, elliptical, rectangular, square, or the like. It should be noted that the embodiment of the present disclosure takes the case that the opening of the recess structure 013 has the first symmetry axis C1 and the second symmetry axis C2 as an example. Optionally, the opening of the recess structure 013 may not have a symmetry axis or has only one symmetry axis (e.g., a first symmetry axis, or a second symmetry axis or other symmetry axes), which is not limited in the embodiments of the present disclosure. For example, the opening of the recess structure 013 may be triangular, polygonal or irregular.

Figure 3:
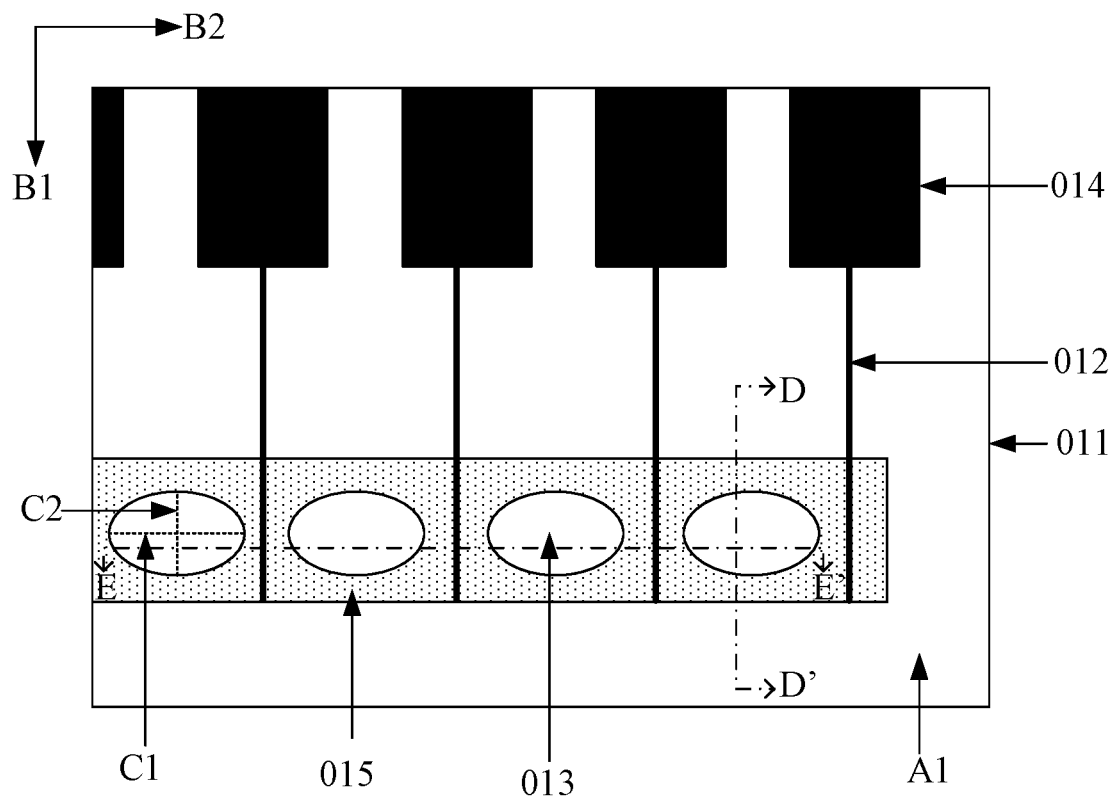
FIG. 3 is a partial schematic structural diagram of yet another display motherboard according to an embodiment of the present disclosure.
Figure 4:
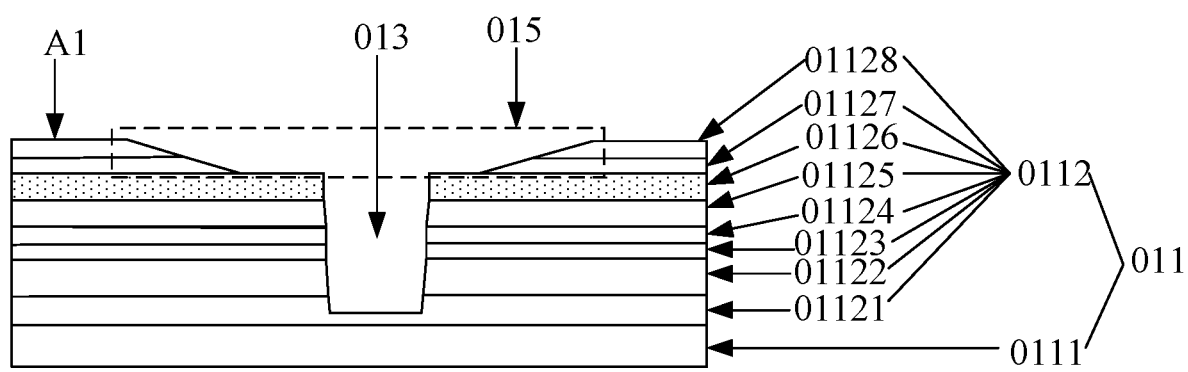
FIG. 4 is a schematic diagram of a cross section DD' in FIG. 3 according to an embodiment of the present disclosure.

FIG. 3 is a partial schematic structural diagram of yet another display motherboard according to an embodiment of the present disclosure. FIG. 4 is a schematic diagram of a cross section DD' in FIG. 3 according to an embodiment of the present disclosure. With reference to FIGS. 3 and 4, on the basis of FIG. 2, the motherboard body 011 is further provide with a cutting groove 015 where the n recess structures 013 may be disposed. In this way, the opening of the recess structure 013 is on a bottom surface of the cutting groove 015.

Optionally, the cutting groove 015 may be stripe-shaped. A lengthwise direction of the cutting groove 015 is perpendicular to an extension direction B1 of the leads 012 and is parallel to the arrangement direction B2 of the plurality of leads 012 (i.e., the arrangement direction of the n recess structures). Since the recess structure 013 is in the cutting groove 015, a maximal length of the cutting groove 015 is greater than a maximal length of the recess structure 013 in the extension direction B1 of the leads 012. Further, the cutting groove 015 may have a third symmetry axis (not shown in FIG. 3 or FIG. 4) which may be parallel to the arrangement direction B2 of the plurality of leads 012. Optionally, the third symmetry axis may pass through the center of the opening, at the bottom surface of the cutting groove, of each of the recess structures 013, and in this way, the third symmetry axis may be the same as the first symmetry axis C1 of the opening.

Referring to FIG. 4, the motherboard body 011 may include an organic layer 0111 and an inorganic layer 0112 that are stacked. The target surface A1 of the motherboard body 011 is the surface of the inorganic layer 0112 distal from the organic layer 0111. The plurality of leads 012 in the display motherboard 01 is on the surface of the inorganic layer 0112 distal from the organic layer 0111.

Optionally, the organic layer 0111 may be made from polyimide (PI) or other organic materials (such as acrylic ester, epoxy resin, polypropylene, or polybutadiene). The inorganic layer 0112 may include: a barrier layer 01121, a buffer layer 01122, a first gate insulating layer 01123, a second gate insulating layer 01124, an interlayer dielectric (ILD) layer 01125, a passivation (PVX) layer 01126, a planarization (PLN) layer 01127 and a pixel delineation layer (PDL) 01228 which are sequentially arranged in a direction going distally from the organic layer 0111. It should be noted that the inorganic layer 0112 may also include other film layers, such as a gate electrode layer and a source-drain electrode layer (not shown in FIG. 4), which is not limited in the embodiments of the present disclosure.

The cutting groove 015 in the motherboard body 011 may penetrate the PLN layer 01127 and the PDL layer 01228, and the bottom surface of the cutting groove 015 may be the surface of the PVX layer 01126 distal from the organic layer 0111. The recess structure 013 may penetrate the PVX layer 01126, the ILD layer 01125, the second gate insulating layer 01124, the first gate insulating layer 01123, the buffer layer 01122 and part of the barrier layer 01121, and the bottom surface of the recess structure 013 is in the barrier layer 01121. Optionally, the recess structure 013 may also penetrate the whole barrier layer 01121, and in this way, the bottom surface of the recess structure 013 may be on the surface of the organic layer 0111 proximal to the inorganic layer 0112.

In addition, the embodiments of the present disclosure take the case that the motherboard body 011 includes the organic layer 0111 and the inorganic layer 0112 as an example. Optionally, the motherboard body 011 may not include the organic layer 0111, or the motherboard body 011 may not include the inorganic layer 0112.

Figure 5:
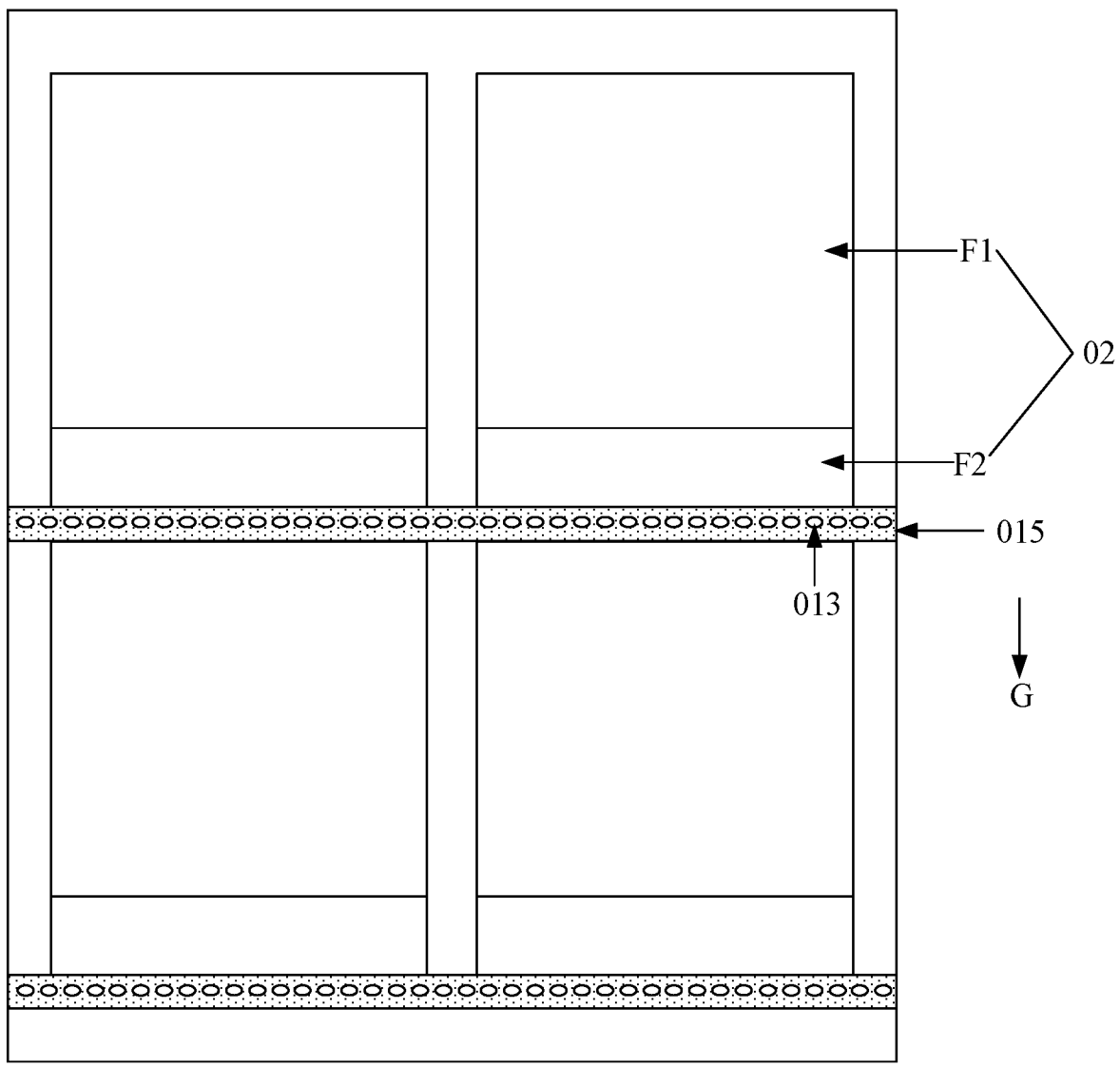
FIG. 5 is a schematic structural diagram of a display motherboard according to an embodiment of the present disclosure.

FIG. 5 is a schematic structural diagram of a display motherboard according to an embodiment of the disclosure. As shown in FIG. 5, the display motherboard 01 may be generally divided into a plurality of display substrates 02, and the plurality of display substrates 02 may be arranged in an array. Each display substrate 02 may include a display area F1 and a binding area F2, and the binding area F2 is in a first direction G of the display area F1. An electrode (not shown in FIG. 5) of the display area F1 is electrically connected to the lead (not shown in FIG. 5) in the binding area F2, and the lead in the binding area F2 is configured to be electrically connected to the FPC (not shown in FIG. 5). The display motherboard 01 may be provided with a plurality of cutting grooves 015 in one-to-one correspondence with a plurality of rows of display substrates 02. The cutting groove 015 corresponding to each row of display substrates 02 is in the first direction G of the binding area F2 in the row of display substrates 02. It should be noted that the display motherboard 01 is provided with a plurality of cutting grooves 015, and the recess structures 013 are provided in each cutting groove 015.

Figure 6:
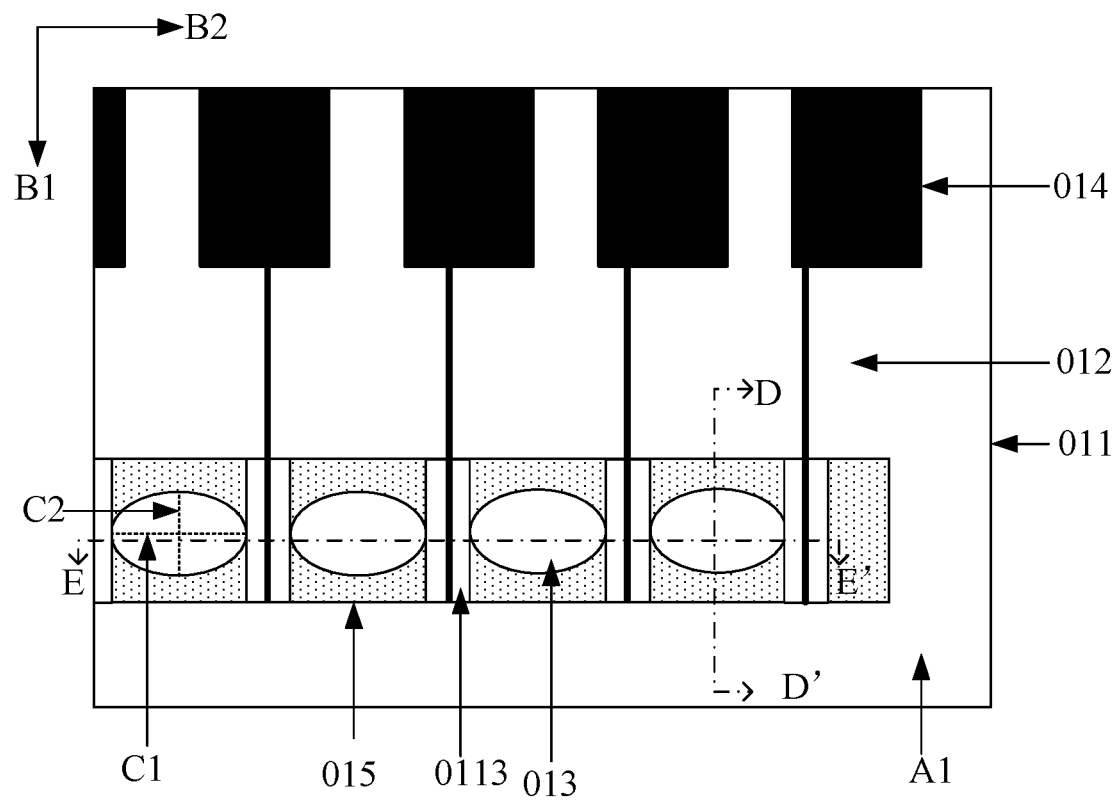
FIG. 6 is a partial schematic structural diagram of still another display motherboard according to an embodiment of the present disclosure.
Figure 7:
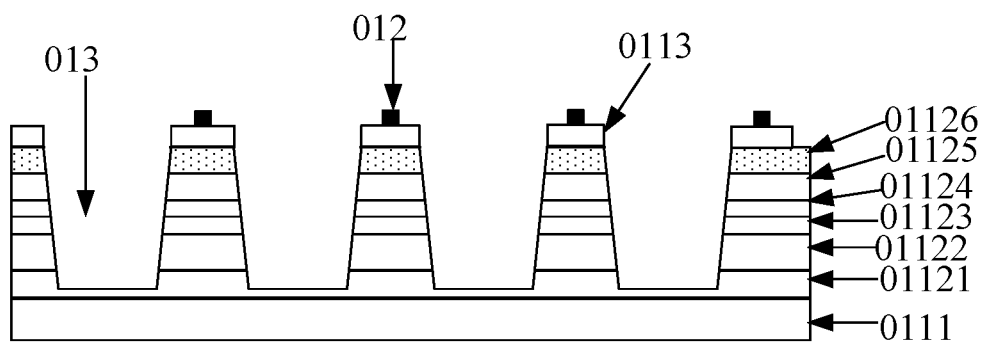
FIG. 7 is a schematic diagram of a cross section EE' in FIG. 6 according to an embodiment of the present disclosure.

FIG. 6 is a partial schematic structural diagram of still another display motherboard according to an embodiment of the present disclosure. FIG. 7 is a schematic diagram of a cross section EE' in FIG. 6 according to an embodiment of the present disclosure. With reference to FIGS. 6 and 7, the motherboard body 011 may further include a light-shielding layer 0113 on the basis of FIGS. 3 and 4.

The light-shielding layer 0113 is on the side of the organic layer 0111 proximal to the plurality of leads 012. In the embodiment of the present disclosure, the light-shielding layer 0113 is on the surface, proximal to the plurality of leads 012, of the PVX layer 01126 in the inorganic layer 0112, and the plurality of leads 012 is on the surface, distal from the inorganic layer 0112, of the light-shielding layer 0113. Optionally, the light-shielding layer 0113 may also be disposed anywhere on the side of the organic layer 0111 proximal to the plurality of leads 012. For example, the light-shielding layer 0113 is between the organic layer 0111 and the inorganic layer 0112, or on the sides, proximal to the plurality of leads, of film layers other than the PVX layer in the inorganic layer 0112.

An orthographic projection of the light-shielding layer 0113 on the organic layer 0111 at least partially overlaps orthographic projections of the plurality of leads 012 on the organic layer 0111, and is outside orthographic projections of the recess structures 013 on the organic layer 0111. It can be seen that the light-shielding layer 0113 may shield the part of the organic layer 0111 under the leads 012 to prevent laser, which is adopted to irradiate the recess structures 013, from irradiating the part of the organic layer 0111 under the leads 012.

In addition, the embodiments of the present disclosure take the case that the motherboard body 011 includes the organic layer 0111, the inorganic layer 0112 and the light-shielding layer 0113 as an example. Optionally, the motherboard body 011 may not include the light-shielding layer 0113 or may not include the inorganic layer 0112.

Further, the light-shielding layer 0113 may be made from a reflective material or a light-absorbing material (such as carbon, a photoresist doped with black particles and the like). The reflectivity of the reflective material may be greater than 50%. For example, the reflective material may include metals such as gold, copper or molybdenum. When the reflectivity of the reflective material is greater than 80%, the reflective material may reflect more laser, which may further reduce laser that irradiates the part of the organic layer 0111 under the leads 012.

In summary, in the display motherboard according to the embodiment of the present disclosure, the n recess structures for guiding the motherboard body to fracture are provided on the target surface of the motherboard body. In this way, during cutting of the display motherboard, a physical force may be applied to make the display motherboard fracture along the target path that passes through the n recess structures. In this process, it is unnecessary to irradiate the display motherboard by laser, thereby enriching the cutting mode of the display motherboard.

Optionally, the recess structure in the embodiments of the present disclosure may be a pit or a through hole. The embodiments of the present disclosure take the case that the recess structure is the pit as an example. Regardless of whether the recess structure is a pit or a through hole, a physical force may be directly applied to make the display motherboard fracture along the target path that passes through the n recess structures during cutting of the display motherboard. If the recess structure is the pit, during cutting of the display motherboard, laser may be adopted to irradiate the n recess structures in the motherboard body to turn the n recess structures into n through holes, and then a physical force is applied to make the display motherboard fracture along the target path that passes through the n recess structures. In the case that the n recess structures are irradiated by laser, if the organic material in the display motherboard is carbonized into the carbon granules, the carbon granules are less likely to be deposited on the leads since the recess structures are between the adjacent leads, and the probability of short circuits between the leads due to the carbon granules is thereof also low. Therefore, the manufacturing yield of the display substrate obtained by cutting the display motherboard is improved.

FIG. 8 is a flowchart of a method for manufacturing a display motherboard according to an embodiment of the present disclosure. The method is applicable to the manufacturing of any of the display motherboards (e.g., the display motherboard shown in FIG. 1) according to the embodiments of the present disclosure. As shown in FIG. 8, the method for manufacturing the display motherboard may include the following step.

In S701, a motherboard body is manufactured. Wherein n recess structures for guiding the motherboard body to fracture are provided on a surface of the motherboard body, and n is greater than or equal to 1.

In the display motherboard manufactured by the method according to the embodiment of the present disclosure, the n recess structures for guiding the motherboard body to fracture are provided on the surface of the motherboard body. In this way, during cutting of the display motherboard, a physical force may be applied to make the display motherboard fracture along the target path that passes through the n recess structures. In this process, it is unnecessary to irradiate the display motherboard by laser, thereby enriching the cutting modes of the display motherboard are enriched.

FIG. 9 is a flowchart of another method for manufacturing a display motherboard according to an embodiment of the present disclosure. The method is applicable to the manufacturing of the display motherboard as shown in FIGS. 3 and 4. As shown in FIG. 9, the method for manufacturing the display motherboard may include the following steps.

In S801, an organic layer and an inorganic material layer that are stacked are formed.

The inorganic material layer is intended to form an inorganic layer in a motherboard body. Exemplarily, the organic layer may be made from PI or other organic materials. The inorganic material layer may include eight film layers, which are sequentially arranged in a direction going distally from the organic layer and made from inorganic materials. The eight film layers made from the inorganic materials are intended to form the above barrier layer, buffer layer, first gate insulating layer, second gate insulating layer, ILD layer, PVX layer, PLN layer and PDL in the inorganic layer.

During the formation of the organic layer and each of the eight film layers made from the inorganic materials, by means of such as coating, physical vapor deposition (PVD) or chemical vapor deposition (CVD), may be adopted. PVD includes such a physical deposition method as magnetron sputtering or thermal evaporation, and CVD includes such a chemical deposition method as plasma enhanced chemical vapor deposition (PECVD).

Figure 10:
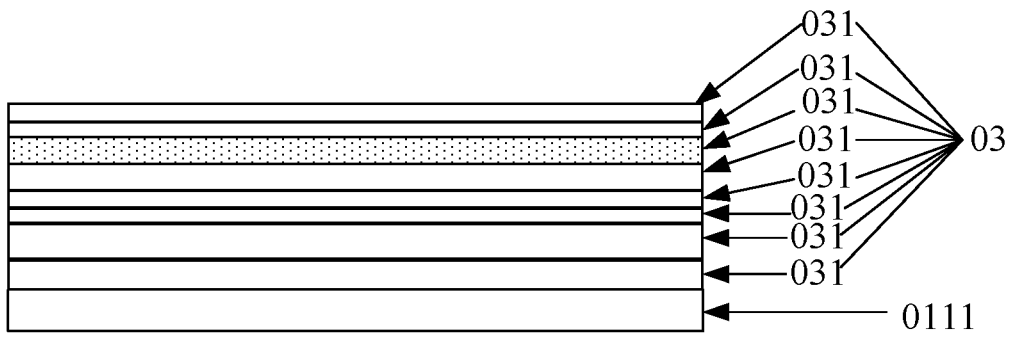
FIG. 10 is a schematic diagram showing a manufacturing process of a display motherboard according to an embodiment of the present disclosure.

Exemplarily, the organic layer 0111 and the inorganic material layer 03 formed in S801 may be as shown in FIG. 10. In the inorganic material layer, the eight film layers 031 made from the inorganic materials are sequentially arranged in a direction going distally from the organic layer 0111.

In S802, a cutting groove is formed in the surface, distal from the organic layer, of the inorganic material layer.

After the inorganic material layer is formed, laser (such as carbon dioxide laser or femtosecond laser) may be adopted to irradiate the surface, distal from the organic layer, of the inorganic material layer to form the cutting groove in the surface.

Figure 11:
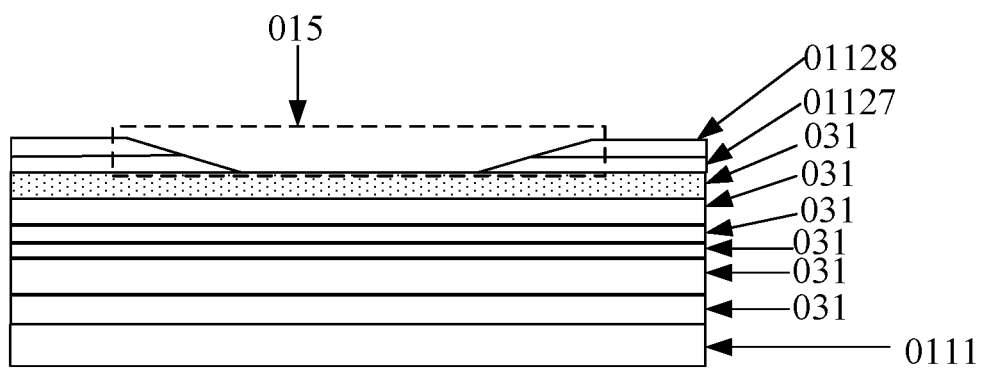
FIG. 11 is a schematic diagram showing another manufacturing process of a display motherboard according to an embodiment of the present disclosure.

The cutting groove 015 formed in S802 may be as shown in FIG. 11. After the cutting groove 015 is formed, the film layer, farthest from the organic layer 0111, among the eight film layers 031 made from the inorganic materials forms the PDL 01128, and the film layer which is second farthest from the organic layer 0111 forms the PLN layer 01127. At this time, the cutting groove 015 penetrates the PDL 01128 and the PLN layer 01127, and a bottom surface of the cutting groove is on the surface (distal from the organic layer 0111) of the film layer which is third farthest from the organic layer 0111 in the eight film layers 031 made from the inorganic materials.

In S803, n recess structures for guiding the motherboard body to fracture are formed on a bottom surface of the cutting groove to obtain the motherboard body.

After the formation of the cutting groove, n recess structures may be formed on the bottom surface of the cutting groove. The recess structures may be formed by means of etching. Optionally, the recess structures may be formed by other methods, such as laser irradiation, which is not limited in the embodiments of the present disclosure.

After the recess structures are formed, six film layers closer to the organic layer 0111 in the eight film layers 031 made from the inorganic materials form the barrier layer 01121, the buffer layer 01122, the first gate insulating layer 01123, the second gate insulating layer 01124, the ILD layer 01125 and the PVX layer 01126. The recess structures 013 penetrate the PVX layer 01126, the ILD layer 01125, the second gate insulating layer 01124, the first gate insulating layer 01123, the buffer layer 01122 and part of the barrier layer 01121, and bottom surfaces of the recess structures 013 are within the barrier layer 01121.

The PDL 01128, the PLN layer 01127, the PVX layer 01126, the ILD layer 01125, the second gate insulating layer 01124, the first gate insulating layer 01123, the buffer layer 01122 and the barrier layer 01121 constitute the inorganic layer 0112, and the inorganic layer 0112 and the organic layer 0111 further constitute the motherboard body 011.

In S804, a plurality of leads are formed on a target surface of the motherboard body to obtain a display motherboard.

After the motherboard body is obtained, a plurality of leads may be formed on the target surface (i.e., the surface of the inorganic layer distal from the organic layer) of the motherboard body to obtain the display motherboard as shown in FIGS. 3 and 4, and the recess structure formed in S803 is between any two adjacent leads.

During the formation of the plurality of leads, a conductive material layer may be formed on the target surface by means of coating, PVD, CVD and the like, and then the conductive material layer is processed by a patterning process to obtain the plurality of leads. The patterning process includes: coating, exposing, development, etching and stripping of a photoresist. Processing the conductive material layer by the patterning process includes: coating the conductive material layer with a layer of the photoresist; then exposing the photoresist with a mask such that an exposed area and a non-exposed area is formed on the photoresist; processing with a development process to remove the photoresist in one of the exposed area and the non-exposed area while the photoresist in another area is retained; then, etching an area not covered with the photoresist on the conductive material layer; and after etching is completed, stripping the photoresist on the conductive material layer to obtain the plurality of leads. It should be noted that the photoresist may be a positive photoresist or a negative photoresist. If the photoresist is a positive photoresist, the photoresist in the exposed area is removed while the photoresist in the non-exposed area is retained after the development process; and if the photoresist is a negative photoresist, the photoresist in the non-exposed area is removed while the photoresist in the exposed area is retained after the development process.

In summary, according to the display motherboard manufactured by the method according to the embodiment of the present disclosure, the n recess structures for guiding the motherboard body to fracture are provided on the surface of the motherboard body. In this way, during cutting of the display motherboard, a physical force may be applied to make the display motherboard fracture along the target path that passes through the n recess structures. In this process, it is unnecessary to irradiate the display motherboard by laser, thereby enriching the cutting modes of the display motherboard.

Optionally, the recess structure in the embodiments of the present disclosure may be a pit or a through hole. The embodiments of the present disclosure take the case that the recess structure is the pit as an example. Regardless of whether the recess structure is the pit or through hole, a physical force may be directly applied to make the display motherboard fracture along the target path that passes through the n recess structures during cutting of the display motherboard. If the recess structure is the pit, during cutting of the display motherboard, laser may be adopted to irradiate the n recess structures in the motherboard body to turn the n recess structures into n through holes, and then a physical force is applied to make the display motherboard fracture along the target path that passes through the n recess structures. In the case that the n recess structures are irradiated by laser, if the organic material in the display motherboard is carbonized into the carbon granules, the carbon granules are less likely to be deposited on the leads since the recess structures are between the adjacent leads, and the probability of short circuits between the leads due to the carbon granules is thereof also low. Therefore, the manufacturing yield of the display substrate obtained by cutting the display motherboard is improved.

It should be noted that the embodiment shown in FIG. 9 takes the case of manufacturing of the display motherboard as shown in FIGS. 3 and 4 as an example. When the display motherboard further includes a light-shielding layer, it is necessary to add a process of forming the light-shielding layer based on the embodiment shown in FIG. 9, such that the display motherboard includes the light-shielding layer on the side, proximal to the plurality of leads, of the organic layer.

Exemplarily, during the manufacture of the display motherboard shown in FIGS. 6 and 7, the light-shielding layer may be formed on the PVX layer after the formation of n recess structures. Optionally, a light-shielding material layer may also be formed on the PVX layer after the formation of the cutting groove, and then, after the formation of the n recess structures, the light-shielding material layer is processed by a patterning process to obtain the light-shielding layer.

Figure 12:
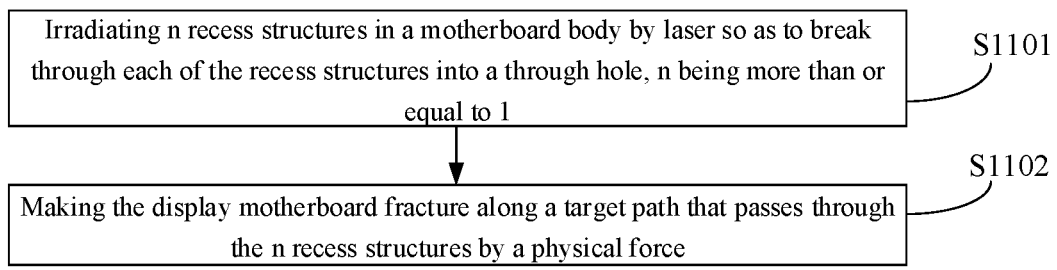
FIG. 12 is a flowchart of a method for cutting a display motherboard according to an embodiment of the present disclosure.

FIG. 12 is a flowchart of a method for cutting a display motherboard according to an embodiment of the present disclosure. The cutting method may be used for cutting the display motherboard shown in any one of FIGS. 2 to 7, and takes the case that the recess structure in the display motherboard is a pit as an example. As shown in FIG. 12, the method for cutting the display motherboard may include the following steps.

In S1101, n recess structures in a motherboard body is irradiated by laser, so as to break through each recess structure into a through hole, and n is greater than or equal to 1.

Figure 13:
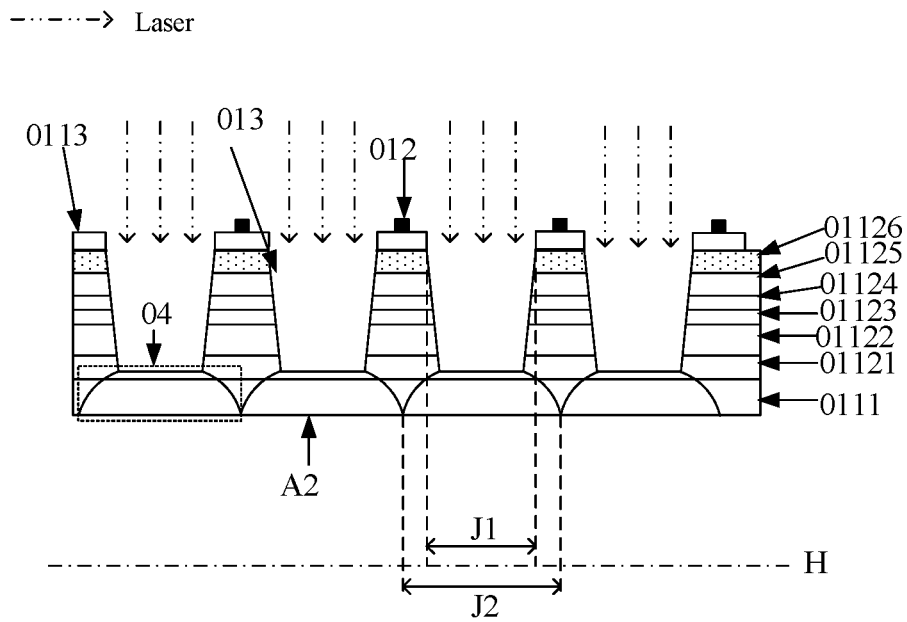
FIG. 13 is a schematic diagram showing a cutting process of a display motherboard according to an embodiment of the present disclosure.
Figure 14:
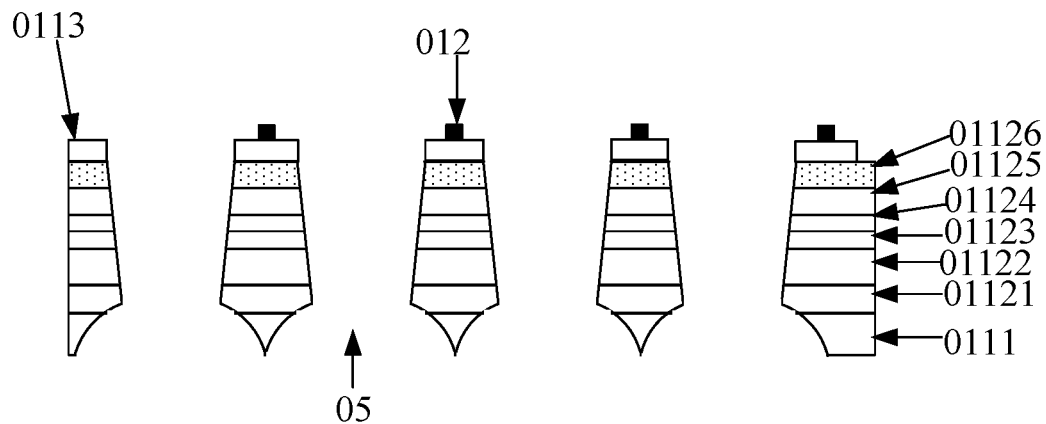
FIG. 14 is a schematic diagram showing another cutting process of a display motherboard according to an embodiment of the present disclosure.

In S1101, as shown in FIG. 13, laser (such as femtosecond laser or picosecond laser) may be adopted to irradiate each recess structure 013 in the motherboard body 011 to remove a spacer portion 04 between the recess structure 013 and an auxiliary surface A2, such that the recess structure 013 is in communication with the auxiliary surface A2 (facing to the target surface A1 of the motherboard body) of the motherboard body 011, and the recess structure 013 is changed from a pit into a through hole that penetrates the motherboard body 011. After S1101, n such through holes are formed in the motherboard body 011. Exemplarily, the n through holes 05 formed in the motherboard body may be as shown in FIG. 14.

It should be noted that when the recess structure is irradiated by laser, if an organic material in the display motherboard is carbonized into carbon granules, the carbon granules are less likely to be deposited on the leads since the recess structure is between the adjacent leads.

In the embodiment of the present disclosure, after the spacer portion between the recess structure and the auxiliary surface is removed, the recess structure is in communication with the auxiliary surface. As shown in FIG. 13, an orthographic projection area J1 of the recess structure 013 on a reference plane H may be within an orthographic projection area J2 of the spacer portion 04 corresponding to the recess structure on the reference plane H. For example, the orthographic projection area J1 is smaller than the orthographic projection area J2. In this way, more films in the display motherboard may be broken in a large area, and connection between the adjacent leads in the display motherboard may be weakened. Optionally, the orthographic projection area J2 may also be within the orthographic projection area J1, which is not limited in the embodiments of the present disclosure. The reference plane H is parallel to the auxiliary surface A2.

Further, the spacer portion 04 may be in various shapes, and correspondingly, the through holes 05 formed by removing the spacer portion may also be in various shapes. FIG. 13 takes the case that the spacer portion 04 is trumpet-shaped, and the end having a larger area of the spacer portion 04 is distal from the recess structure as an example. Optionally, the spacer portion 04 may take a shape different from the shape as shown in FIG. 13. For example, the spacer portion takes the shape of a cylinder, a truncated cone, or the like. At this time, the shape of the through hole 05 in FIG. 14 is also changed accordingly.

Optionally, when the spacer portion 04 is trumpet-shaped, each two adjacent spacer portions 04 may be connected. At this time, each two adjacent through holes in the n throughholes formed after S1101 are in communication with each other. In this way, the connection between the adjacent leads in the display motherboard is further weakened.

It should be noted that the embodiment of the present disclosure takes the case that only the spacer portion is removed in S1101 as an example. Optionally, other portions than the spacer portion may also be removed in S1101. When only the spacer portion is removed in S1101, the energy of laser that irradiates the recess structure in S1101 may be reduced, i.e., the recess structure is irradiated by low-energy laser. In addition, when the recess structure is irradiated by laser, the spacer portion under the recess structure is in a heat-affected area of laser and will be removed. In the embodiment of the present disclosure, the energy of laser may be adjusted, such that the removed spacer portions under the adjacent recess structures are connected. Further, the part of the organic layer, not under the recess structure, is also removed. As a result, the strength of the organic layer is weakened.

In addition, it is assumed that laser irradiates the area, not having the recess structure, in the target surface when the recess structure is irradiated by the laser, this part of laser fails to carbonize the organic layer because this part of laser is lower in energy and the organic layer is farther from the target surface. Therefore, carbon granules formed by carbonizing the organic layer are reduced.

In S1102, a physical force is applied to make the display motherboard fracture along a target path that passes through the n recess structures.

In S1102, physical forces (also called mechanical stresses) in different directions may be applied to the part of the display motherboard on two sides of the target path, such that the display motherboard fractures along the target path that passes through the n recess structures.

Optionally, when n is greater than 1, the opening of each recess structure has a first symmetry axis (referring to the first symmetry axis C1 as shown in FIG. 3), and the n recess structures have the same first symmetry axis. The target path in S1102 may be on the first symmetry axis.

Figure 15:
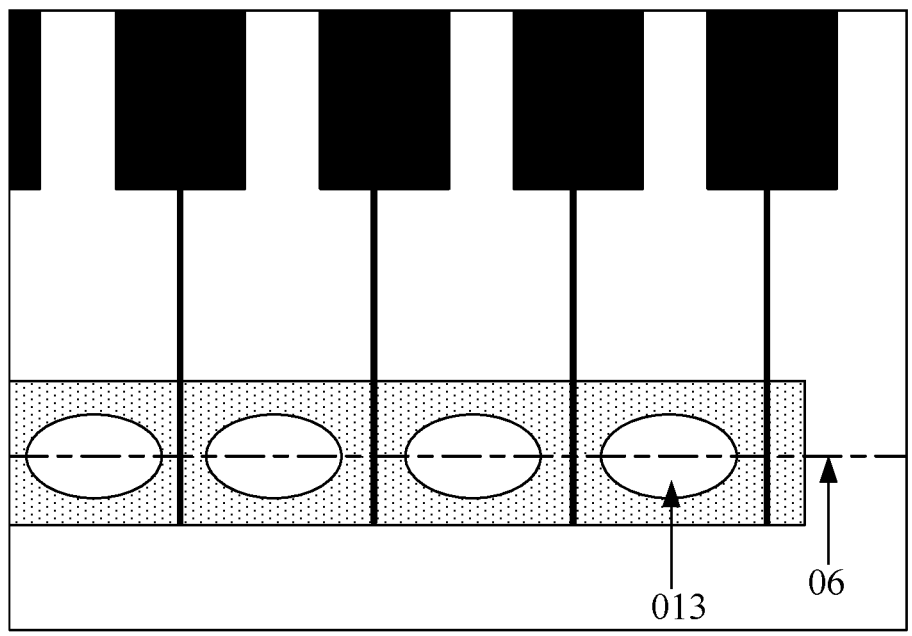
FIG. 15 is a schematic diagram of a target path according to an embodiment of the present disclosure.
Figure 16:
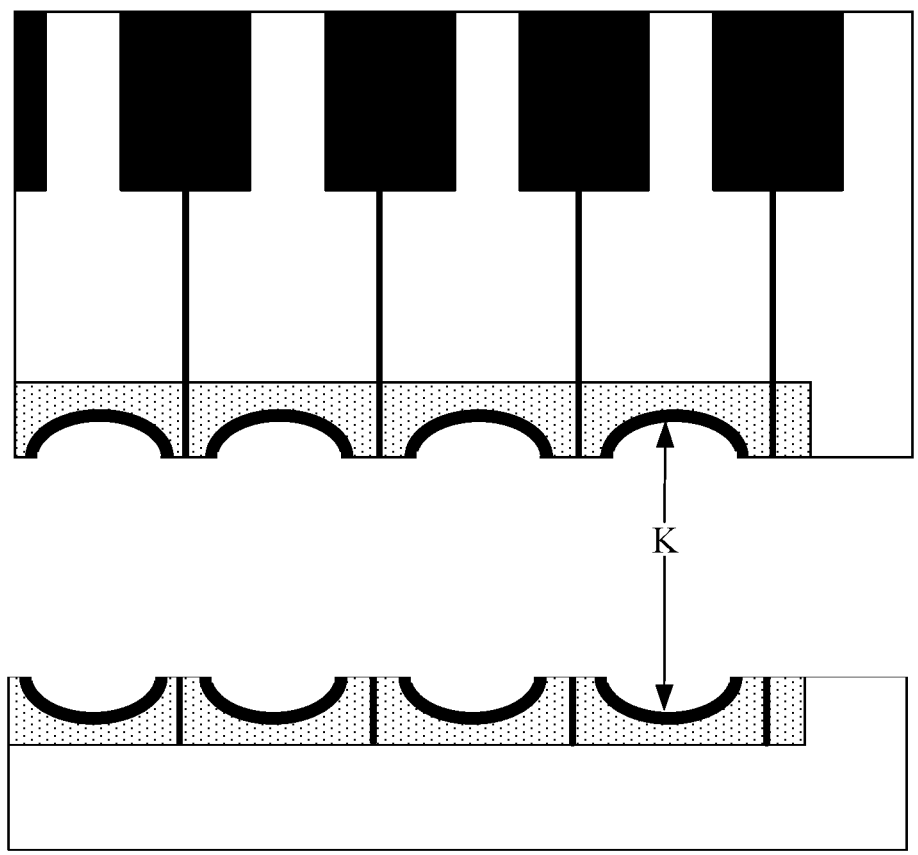
FIG. 16 is a schematic diagram showing yet another cutting process of a display motherboard according to an embodiment of the present disclosure.

Exemplarily, the target path 06 that passes through the n recess structures 013 in the display motherboard may be as shown in FIG. 15. FIG. 16 shows a state obtained after the physical force is applied to make the display motherboard fracture along the target path 06 that passes through the n recess structures. Referring to FIG. 16, since only the recess structure is irradiated by laser in the embodiment of the present disclosure, the carbon granules K formed after carbonizing the organic layer will be deposited at the opening of the recess structure but not on the leads if the display motherboard includes an organic layer.

Figure 17:
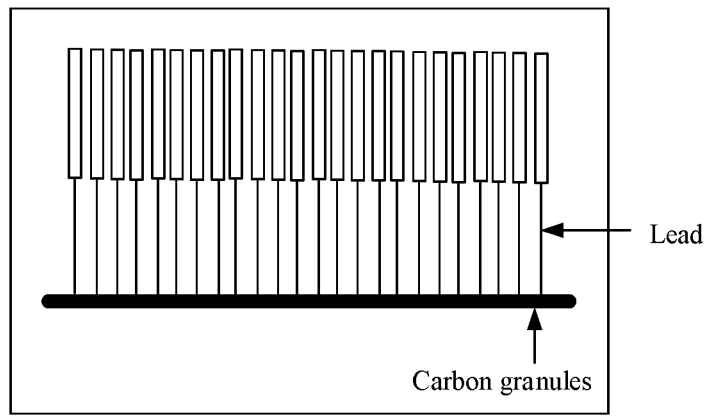
FIG. 17 is a schematic diagram showing cutting of a display motherboard according to the related art.

FIG. 17 is a schematic diagram showing cutting of a display motherboard according to the related art. As shown in FIG. 17, if the display motherboard includes an organic material, carbon granules formed by carbonizing the organic material by laser may be deposited on leads of the display motherboard during cutting of the display motherboard, which will lead to a short circuit between the leads due to the carbon particles. As a result, it is impossible to input a signal (e.g., a data signal) to a display panel through the leads, thereby forming concealed wiring in the display panel. However, in the embodiment of the present disclosure, the carbon granules formed by carbonizing the organic layer by laser are less likely to be deposited on the leads, causing a low probability of the short circuit between the leads. In this way, concealed wiring formed in the display panel is reduced.

In summary, since the target surface of the motherboard body in the display motherboard is provided with n recess structures between adjacent leads, when the recess structure is the pit, laser may be adopted to irradiate the n recess structures in the motherboard body first during the cutting of the display motherboard, so as to turn the n recess structures into n through holes. After that, a physical force is applied to make the display motherboard fracture along a target path that passes through the n recess structures. When the n recess structures are irradiated by laser, since the recess structures are between the adjacent leads, the carbon granules are less likely to be deposited on the leads if the organic material in the display motherboard is carbonized into the carbon granules, and the leads are thereof less likely to be short-circuited due to the carbon granules. Therefore, the manufacturing yield of the display substrate obtained by cutting the display motherboard is improved.

Optionally, when the recess structure is a pit or a through hole, S1102 may be directly performed without S1101 during cutting of the display motherboard, which is not limited in the embodiments of the present disclosure.

Figure 18:
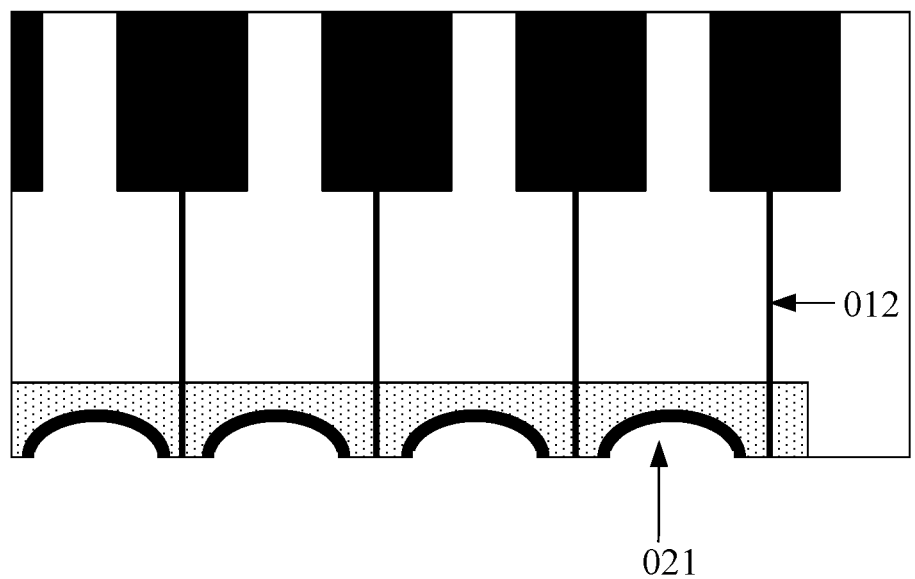
FIG. 18 is a schematic structural diagram of a display substrate according to an embodiment of the present disclosure.

FIG. 18 is a schematic structural diagram of a display substrate according to an embodiment of the present disclosure. The display substrate is obtained by cutting the display motherboard as shown in any one of FIGS. 1 to 7 via the cutting method shown in FIG. 12. As shown in FIG. 18, a surface of the display substrate 02 includes two plate surfaces facing each other (parallel to the target surface and the auxiliary surface of the display motherboard) and a plurality of side surfaces (the side surfaces may be perpendicular to the plate surfaces) for connecting the two plate surfaces.

At least one (e.g., one side surface or a plurality of side surfaces) of the plurality of side surfaces is provided with at least one groove 021 that may be in communication with at least one of the plate surfaces. Optionally, one plate surface of the display substrate is provided with a plurality of leads 012. FIG. 18 is a schematic diagram showing the side, where the plate surface is disposed, of the display substrate 02. The groove 021 is between any two adjacent leads 012.

It should be noted that when a recess structure in the display motherboard is a pit, and S1101 is performed in the process of cutting the display motherboard, the groove 021 may be in communication with the two plate surfaces. When the recess structure in the display motherboard is a through hole, the groove 021 may also be in communication with the two plate surfaces. And when the recess structure in the display motherboard is a pit, and only S1102, without S1101, is performed in the process of cutting the display motherboard, the groove 021 is not in communication with the two plate surfaces but is only in communication with one plate surface where the leads 012 are disposed.

The display substrate may be a flexible substrate or a rigid substrate, which is not limited in the embodiment of the present disclosure.

An embodiment of the present disclosure provides a display device. The display device may include the display substrates (e.g., the display substrate shown in FIG. 18) according to the embodiments of the present disclosure.

The display device may be any product or component having a display function, such as a liquid crystal panel, electronic paper, an organic light emitting diodes (OLED) panel, a light emitting diodes (LED) panel, a mobile phone, a tablet computer, a television, a display, a notebook computer, a digital photo frame or a navigator.

Optionally, the display device may be a flexible display device or a rigid display device, which is not limited in the embodiments of the present disclosure.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. Further, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole description described above, like reference numerals denote like elements.

In the present disclosure, the terms "first" and "second" are used for descriptive purposes only and are not to be construed as indicating or implying relative importance. The term "plurality" refers to two or more, unless specifically defined otherwise.

It should be noted that the method embodiments, the corresponding display motherboard embodiments and the corresponding display substrate embodiments according to the present disclosure may be cross-referenced. The sequence of the steps in the method embodiments may be adjusted appropriately, and the steps may be deleted or added according to the situation. Within the technical scope disclosed in the present disclosure, any variation of the method easily derived by those skilled in the art shall fall within the protection scope of the present disclosure, which is not repeated herein.

Described above are merely optional embodiments of the present disclosure, and are not intended to limit the present disclosure. Within the spirit and principles of the present disclosure, any modifications, equivalent substitutions, improvements, and the like should be within the protection scope of the present disclosure.

What is claimed is:

1. A display motherboard, comprising a motherboard body and a plurality of leads on a surface of the motherboard body, wherein
    n recess structures for guiding the motherboard body to fracture are provided on the surface of the motherboard body, n being greater than 1 and the recess structures are disposed between any two adjacent leads; wherein the n recess structures are arranged in sequence and centers of the n recess structures are collinear; and
    the motherboard body comprises an organic layer and a light-shielding layer;
    wherein the light-shielding layer is between the organic layer and the leads; an orthographic projection of the light-shielding layer on the organic layer is outside an orthographic projection of the recess structure on the organic layer, and is overlapped with at least part of orthographic projections of the plurality of leads on the organic layer.

2. The display motherboard according to claim 1, wherein the recess structure includes a pit or a through hole.

3. The display motherboard according to claim 1, wherein an opening of the recess structure has at least one symmetry axis of a first symmetry axis and a second symmetry axis;
    wherein the first symmetry axis is parallel to an arrangement direction of the n recess structures, and the second symmetry axis is perpendicular to the arrangement direction of the n recess structures.

4. The display motherboard according to claim 1, wherein the motherboard body is further provided with a cutting groove, the n recess structures being in the cutting groove.

5. The display motherboard according to claim 4, wherein the cutting groove is stripe-shaped, a lengthwise direction of the cutting groove being parallel to the arrangement direction of the n recess structures.

6. The display motherboard according to claim 4, wherein a bottom surface of the cutting groove has a third symmetry axis parallel to the arrangement direction of the n recess structures.

7. The display motherboard according to claim 6, wherein the third symmetry axis passes through a center of an opening, at a bottom surface of the cutting groove, of each of the recess structures.

8. The display motherboard according to claim 1, wherein one of the recess structures is between each two adjacent leads.

9. The display motherboard according to claim 1, wherein the motherboard body further comprises an inorganic layer between the light-shielding layer and the leads.

10. A method for manufacturing a display motherboard, the method comprising:
    manufacturing a motherboard body, wherein n recess structures for guiding the motherboard body to fracture are disposed on a surface of the motherboard body, n being greater than 1; and wherein the n recess structures are arranged in sequence and centers of the n recess structures are collinear;
    wherein manufacturing the motherboard body comprises:
    forming an organic layer and an inorganic material layer that are stacked;
    forming a cutting groove in a surface, distal from the organic layer, of the inorganic material layer;
    forming the n recess structures and a light-shielding layer on a bottom surface of the cutting groove to obtain the motherboard body; and
    forming a plurality of leads on the surface of the motherboard body, the recess structures being between any two adjacent leads;
    wherein n is greater than 1, the n recess structures are arranged in sequence, the cutting groove is stripe-shaped, a lengthwise direction of the cutting groove is parallel to an arrangement direction of the n recess structures, the cutting groove has a third symmetry axis, the third symmetry axis being parallel to the arrangement direction of the n recess structures, and the third symmetry axis passing through centers of openings, at a bottom surface of the cutting groove, of the n recess structures;
    the recess structure comprises a pit, and one of the recess structures is between each two adjacent leads, wherein an opening of the recess structure has a first symmetry axis and a second symmetry axis, the first symmetry axis being parallel to the arrangement direction of the n recess structures, and the second symmetry axis being perpendicular to the arrangement direction of the n recess structures.

11. A method for cutting a display motherboard, the display motherboard comprising a motherboard body and a plurality of leads on a surface of the motherboard body, wherein n recess structures for guiding the motherboard body to fracture are provided on the surface of the motherboard body, n being greater than 1, and the recess structures are disposed between any two adjacent leads; and wherein the n recess structures are arranged in sequence and centers of the n recess structures are collinear; and the motherboard body comprises an organic layer and a light-shielding layer; wherein the light-shielding layer is between the organic layer and the leads; an orthographic projection of the light-shielding layer on the organic layer is outside an orthographic projection of the recess structure on the organic layer, and is overlapped with at least part of orthographic projections of the plurality of leads on the organic layer; and the method comprising:
   making the display motherboard fracture along a target path that passes through the n recess structures by a physical force.

12. The method according to claim 11, wherein the recess structure comprises a pit, and before making the display motherboard fracture along the target path that passes through the n recess structures by the physical force, the method further comprises:
   irradiating the n recess structures by laser so as to break through each of the recess structures into a through hole.

13. The method according to claim 12, wherein for each of the n recess structures, a spacer portion in the display motherboard is removed when the recess structure is irradiated by the laser; and
   an orthographic projection area of the recess structure on a reference plane is within an orthographic projection area of the spacer portion on the reference plane, the reference plane being parallel to the display motherboard.

14. The method according to claim 13, wherein the spacer portion is trumpet-shaped, an end having a larger area of the spacer portion is distal from the recess structure, and each two adjacent spacer portions are connected to each other.

* * * * *